United States Patent
Noda et al.

[11] Patent Number: 5,596,529
[45] Date of Patent: Jan. 21, 1997

[54] NONVALATILE SEMICONDUCTOR MEMORY DEVICE

[75] Inventors: Junichiro Noda, Tokyo; Daisuke Tohyama, Kawasaki, both of Japan

[73] Assignee: Kabushiki Kaisha Toshiba, Kawasaki, Japan

[21] Appl. No.: 351,185

[22] Filed: Nov. 30, 1994

[30] Foreign Application Priority Data

Nov. 30, 1993 [JP] Japan ................................ 5-299951

[51] Int. Cl.⁶ .................................................. G11C 11/34
[52] U.S. Cl. .................... 365/185.28; 257/314; 257/316; 257/317; 257/318; 257/370
[58] Field of Search ....................... 365/185.28; 257/314, 257/316, 377, 318, 320

[56] References Cited

U.S. PATENT DOCUMENTS

| | | | |
|---|---|---|---|
| 4,794,562 | 12/1988 | Kato et al. | 365/182 |
| 5,066,992 | 11/1991 | Wu et al. | 357/23.5 |
| 5,282,161 | 1/1994 | Villa | 365/185.28 |

FOREIGN PATENT DOCUMENTS

| | | |
|---|---|---|
| 0256993 | 2/1988 | European Pat. Off. . |
| 0443515 | 8/1991 | European Pat. Off. . |
| 63-84168 | 4/1988 | Japan . |

OTHER PUBLICATIONS

The 13th Annual IEEE Nonvolatile Semiconductor Workshop, J. Noda et al., "A Novel EEPROM Cell for High Density Application and Single Power Supply Power Operation", Feb. 20–22, 1984.
IEDM Tech. Dig., pp. 26–29, 1988, R. Shirota et al., "An Accurate Model of Subbreakdown Due to Band-to-Band Tunneling and Its Application".
IEDM Tech. Dig., pp. 24–27, 1981, J. R. Yeargain et al., "A High Density Floating-Gate EEPROM Cell".

*Primary Examiner*—David C. Nelms
*Assistant Examiner*—F. Niransam
*Attorney, Agent, or Firm*—Banner & Witcoff, Ltd.

[57] ABSTRACT

A select MOS transistor and a data storage MOS transistor are formed in an element region. The transistor has floating-gate electrodes. The floating-gate electrodes are spaced apart above the element region and connected to each other above a field region. Only a tunnel insulating film much thinner than a gate insulating film of the transistor is placed between the floating-gate electrode and a drain region. Only the gate insulating film much thinner than the gate insulating film of the transistor is placed between the floating-gate electrode and the channel region of the transistor. In the element region, the shape of a control electrode is the same as that of the floating-gate electrodes.

23 Claims, 11 Drawing Sheets

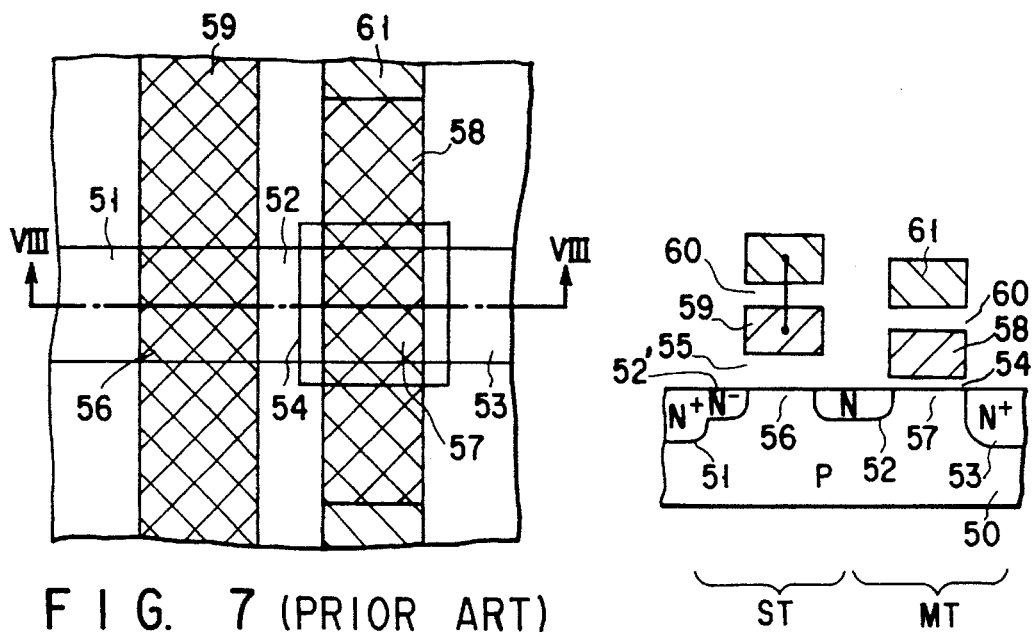
FIG. 7 (PRIOR ART)
FIG. 8 (PRIOR ART)
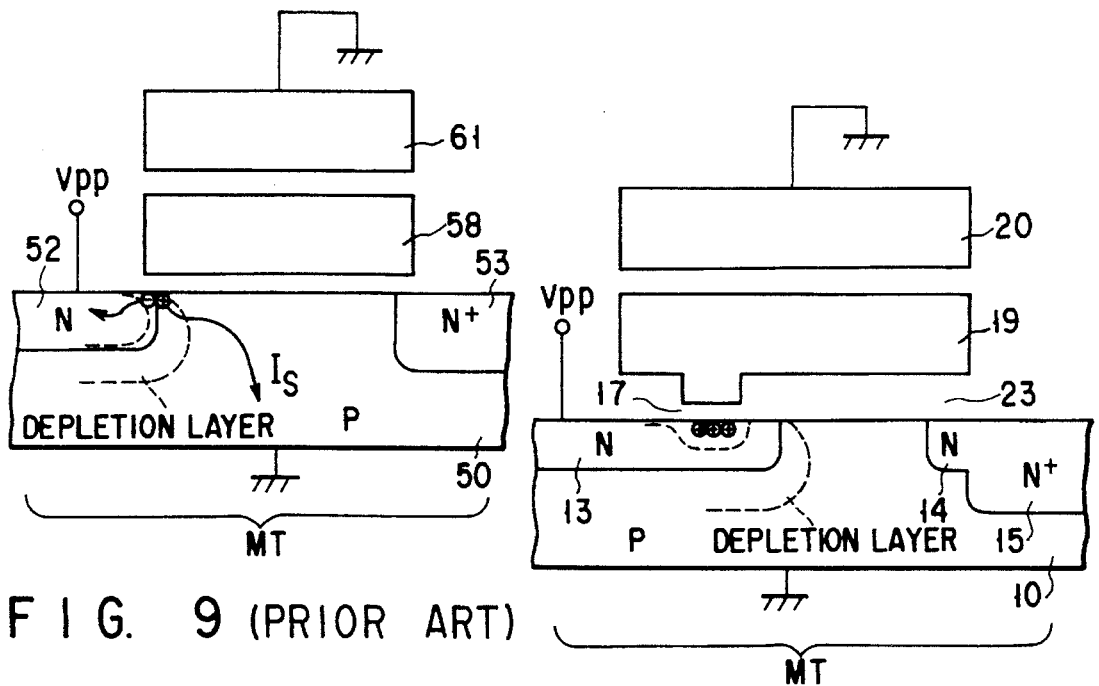
FIG. 9 (PRIOR ART)
FIG. 10 (PRIOR ART)

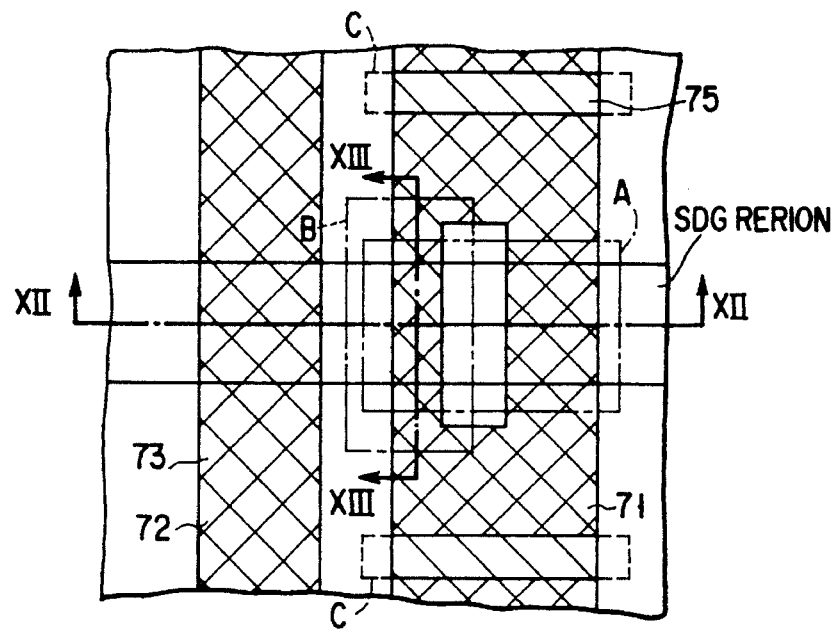
F I G. 11
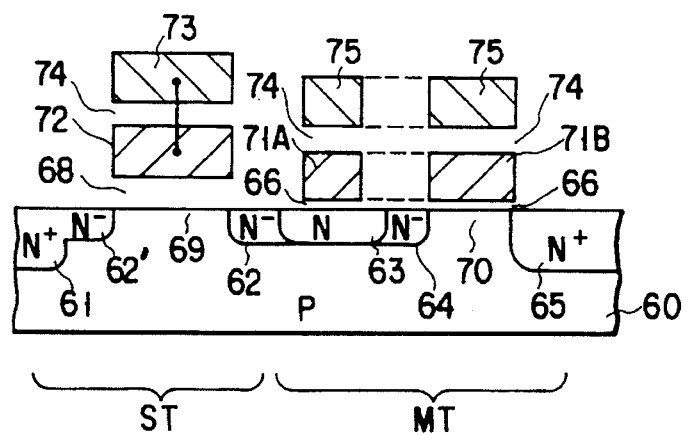
F I G. 12
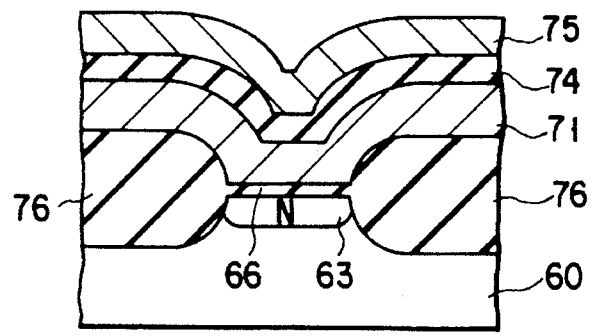
F I G. 13

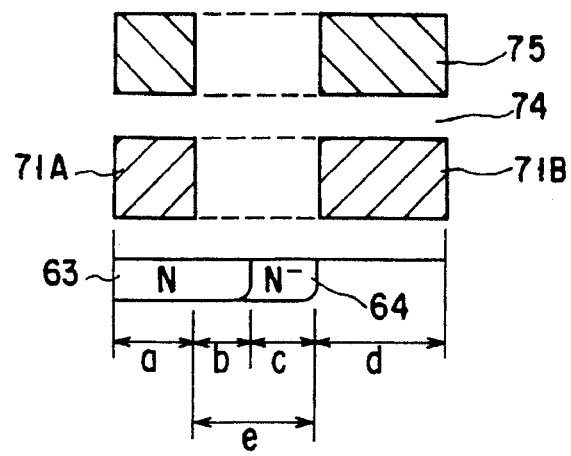
F I G. 14
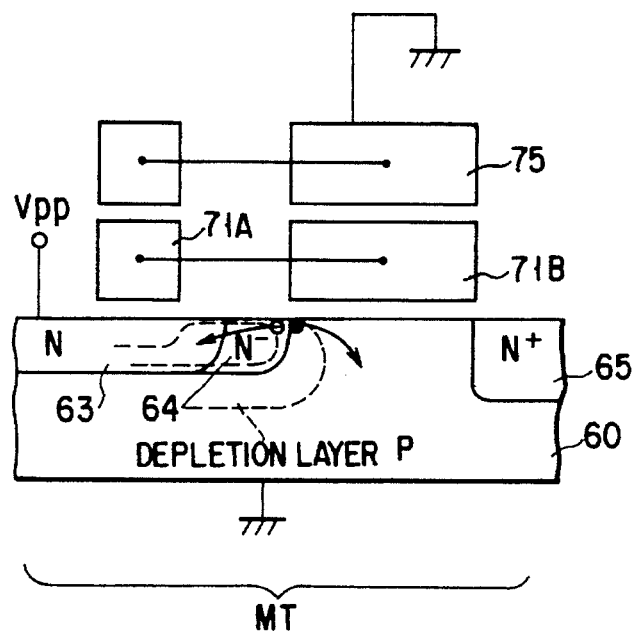
F I G. 15
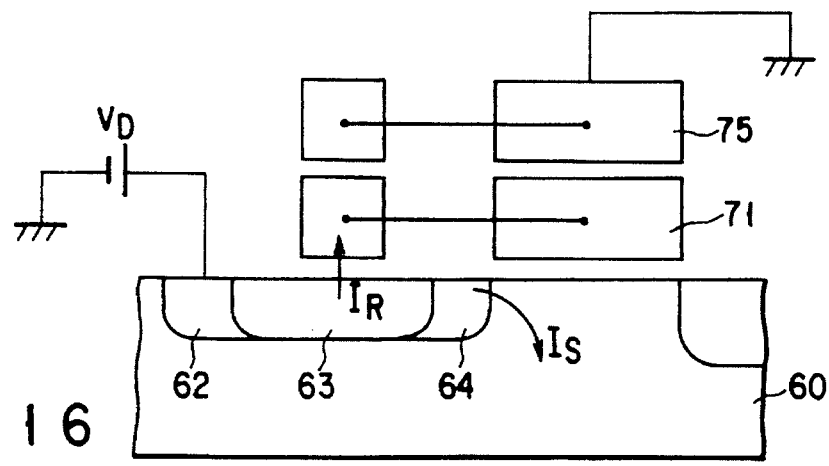
F I G. 16

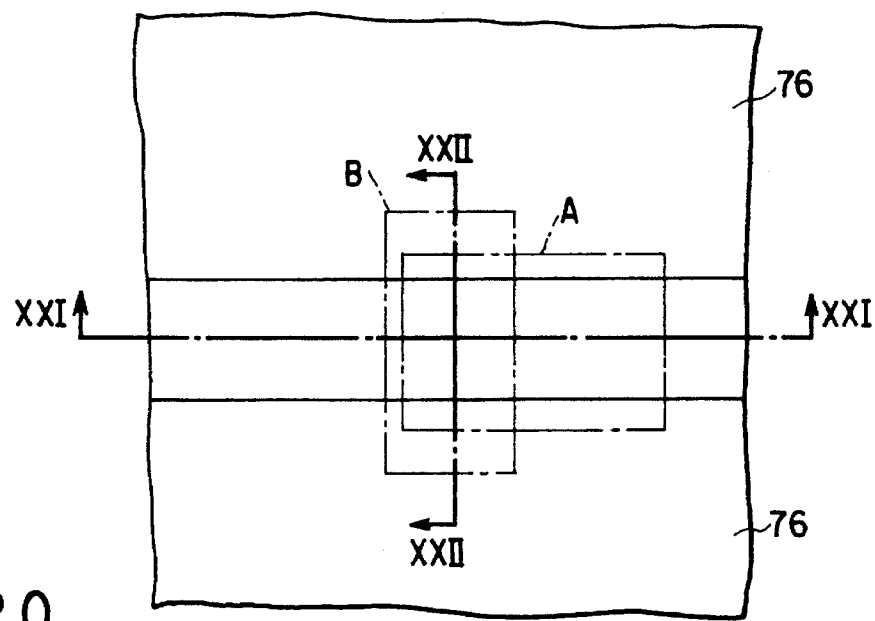
F I G. 20
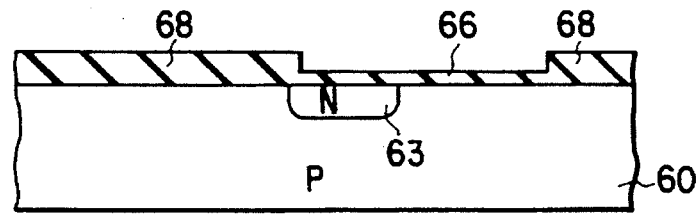
F I G. 21
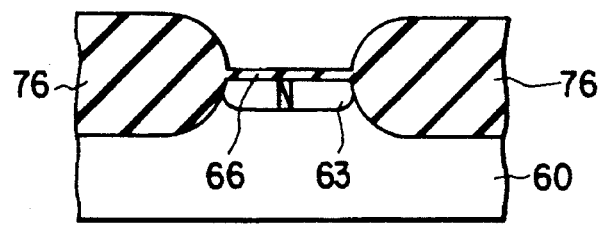
F I G. 22

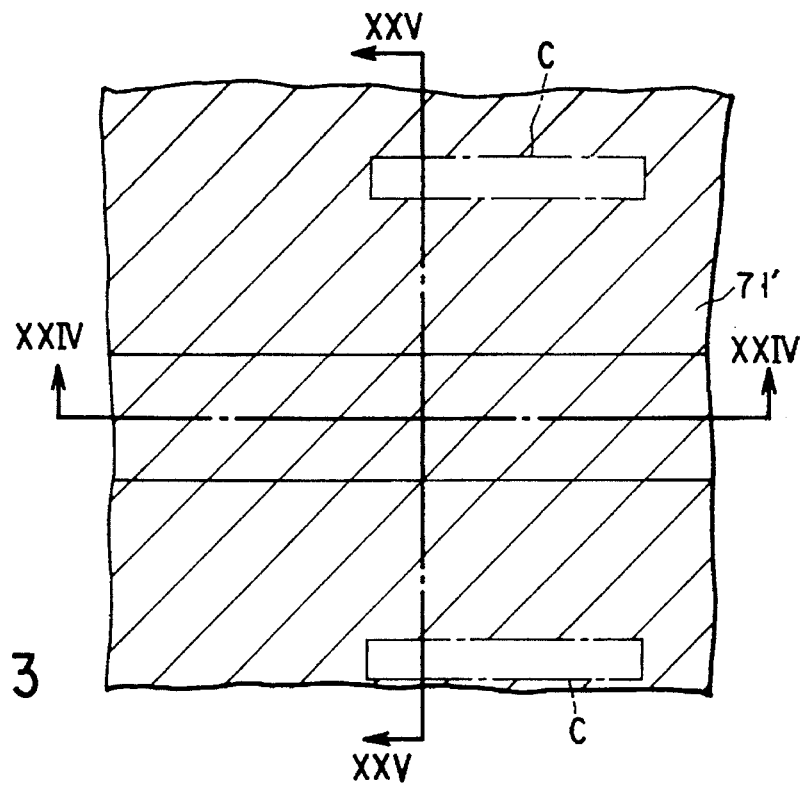
F I G. 23
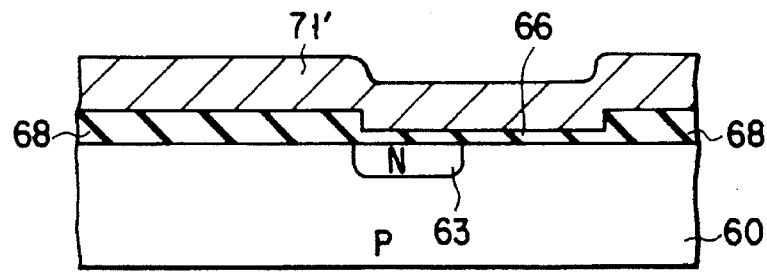
F I G. 24
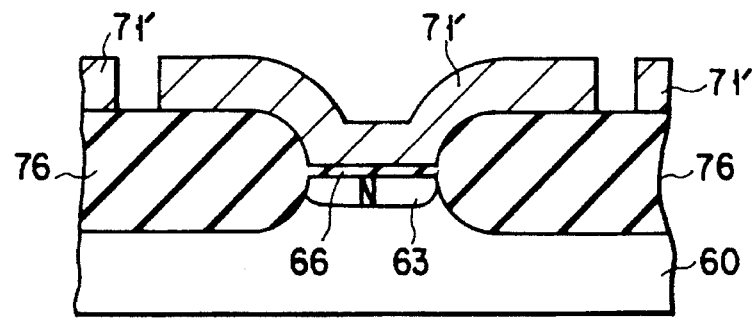
F I G. 25

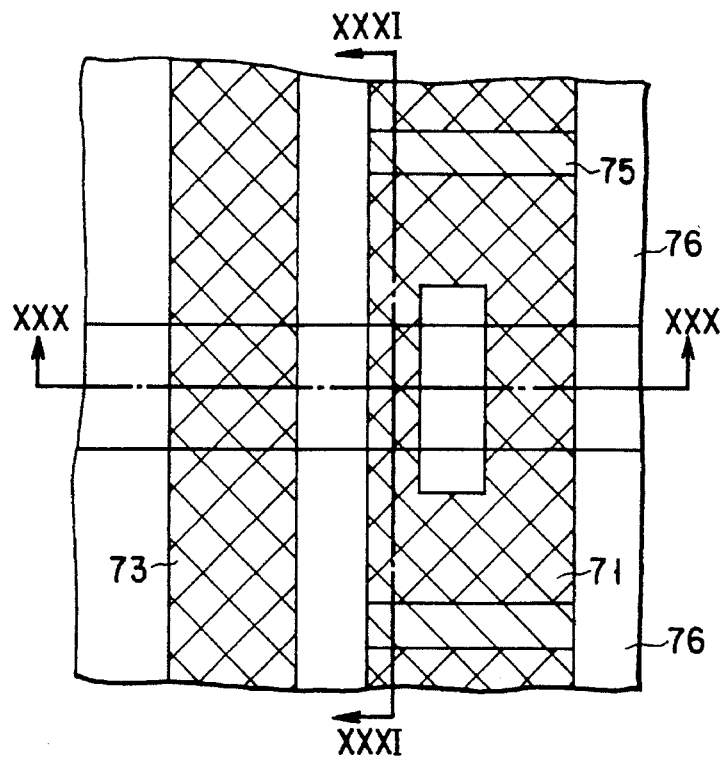
F I G. 29
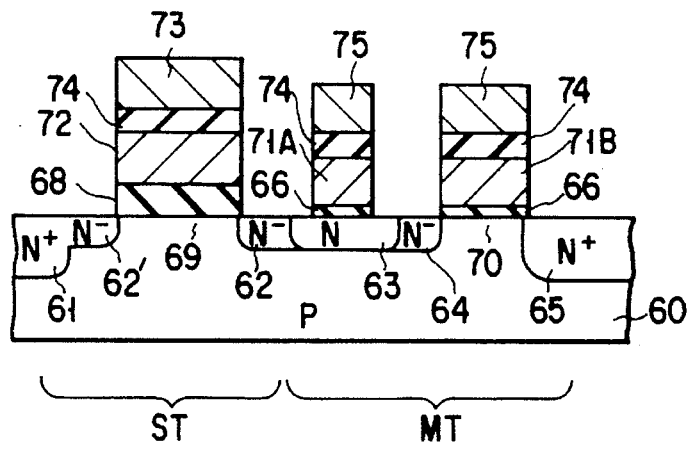
F I G. 30
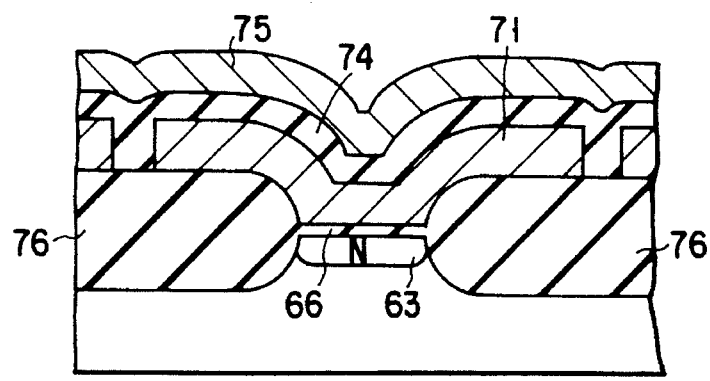
F I G. 31

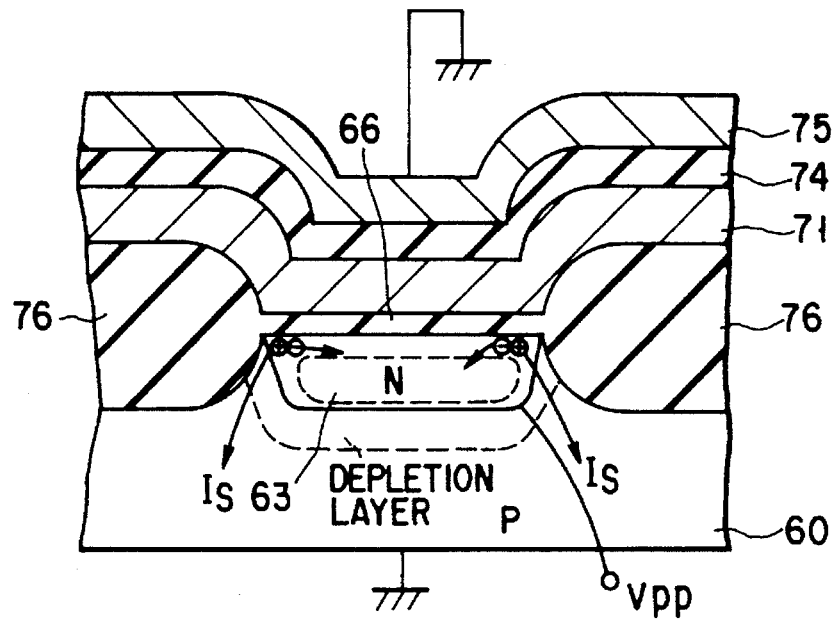
F I G. 32
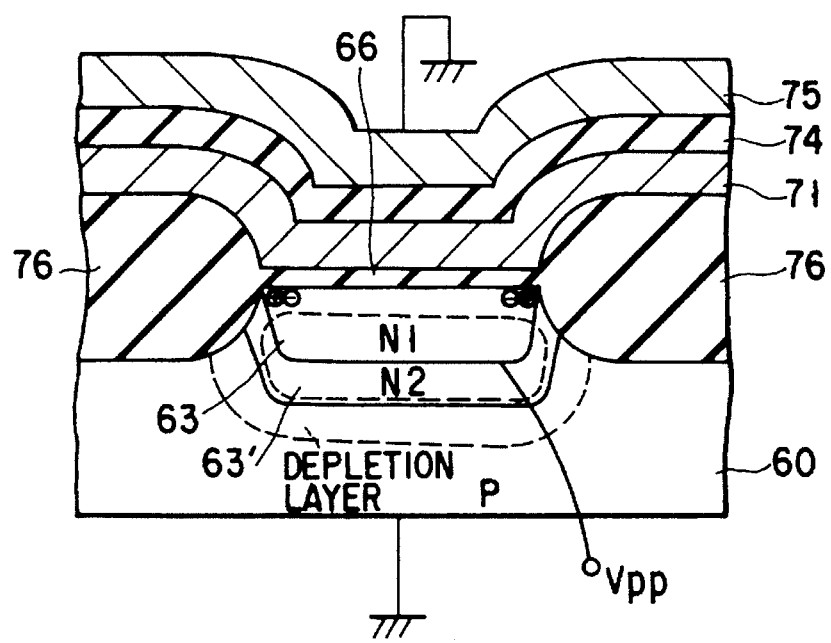
F I G. 33

NONVOLATILE SEMICONDUCTOR MEMORY DEVICE

BACKGROUND OF THE INVENTION

1. Field of the Invention

This invention relates to a nonvolatile semiconductor memory device capable of electrically rewriting data and semipermanently retaining data.

2. Description of the Related Art

Nonvolatile semiconductor memory devices using double-gate MOS transistors with a floating gate and a control gate are well known.

A conventional nonvolatile semiconductor memory device will be explained with reference to FIGS. 1 to 10.

FIGS. 1 and 2 show a first structure of a conventional nonvolatile semiconductor memory device.

The nonvolatile semiconductor memory device is of the most widely used type. FIG. 1 is a plan view of a memory cell in the nonvolatile semiconductor memory device. FIG. 2 is a sectional view taken along line II–II' of FIG. 1.

The memory cell is composed of a data storage MOS transistor MT and a select MOS transistor ST, which are connected to each other in series.

The source region of the select MOS transistor ST and the drain region of the data storage MOS transistor MT are made up of n-type regions 12 and 13 at the surface of a p-type semiconductor substrate 10, respectively.

On a partial surface of the n-type region, a very thin silicon oxide film 17 of nearly 10 nm in thickness is formed. A floating-gate electrode 19 and a control gate electrode 20 are formed on and above the channel region 22 of the data storage MOS transistor MT and the silicon oxide film 17. The floating-gate electrode 19 and control gate electrode 20 are made of polysilicon, for example.

In a place directly under the floating-gate electrode 19 where the silicon oxide film 17 has not been formed, and directly under the gate electrode 18 of the select MOS transistor ST, silicon oxide films 23, 16 (of several tens nm) several times as thick as the silicon oxide film 17 are formed.

The drain region of the select MOS transistor ST is composed of n-type regions 11, 12', and the source region of the data storage MOS transistor MT is made up of n-type regions 14, 15.

With the memory cell of such a configuration, the erasing of data is effected by applying a high potential to the control gate electrode 20 of the data storage MOS transistor MT. Specifically, once a high potential has been applied to the control gate electrode 20, Fowler-Nordheim tunneling allows electrons to move from the n-type region (drain region) 13 via the silicon oxide film 17 to the floating-gate electrode 19.

The writing of data is performed by applying a high potential to the n-type region (drain region) 11 and the gate electrode 18 of the select MOS transistor ST, and 0 V to the control gate electrode 20 of the data storage MOS transistor MT. As a result, the n-type regions (drain region) 12, 13 of the data storage MOS transistor MT are at a high potential, so that the tunnel effect allows electrons to move from the floating-gate electrode 19 to the drain region via the silicon oxide film 17.

Hereinafter, the source region and drain region of the memory cell will be described.

The n-type region (drain region) 13 of the data storage MOS transistor is formed directly under the floating-gate electrode 19 before the floating-gate electrode 19 is formed. On the other hand, the n-type region (source region) 15 of the data storage MOS transistor MT is formed in a self-aligning manner by implanting n-type impurities into the substrate 10 using the floating-gate electrode 19 and control gate electrode 20 as a mask.

when only the n-type region 15 is the source region, however, the channel length of the data storage MOS transistor MT is the distance between the n-type region 13 and the n-type region 15. Therefore, the channel length of the data storage MOS transistor MT varies depending on the misalignment of the mask for forming the n-type region 13 from the mask for forming a polysilicon mask used in forming the n-type region 15.

Since the change of the channel length of the data storage MOS transistor MT results in a change in the characteristics of the memory cell, it is not desirable to form only the source region in a self-aligning manner.

To avoid this problem, the following method is generally used: before the floating-gate electrode 19 is formed, n-type impurities are implanted into region D enclosed by a dot-dash line in FIG. 1, thereby forming the n-type region 13 and n-type region 14 at the same time.

with this method, the channel length of the data storage MOS transistor MT is the distance between the n-type region 13 and the n-type region 14. Since the n-type regions 13, 14 are formed with the same mask, the channel length of the data storage MOS transistor MT is always constant. As a result, the channel length of the data storage MOS transistor MT will not vary due to mask misalignment.

However, this method has a disadvantage in that, to assure the formation of the n-type region 14 directly under the floating-gate electrode 19, the floating-gate electrode 19 must be lengthened along the channel length of the data storage MOS transistor MT, by the sum of the amount of misalignment of the mask for forming the floating-gate electrode 19 and the amount of misalignment of the mask for forming the n-type regions 13, 14.

Hereinafter, the thin silicon oxide film 17 of nearly 10 nm in thickness between the n-type region 13 and the floating-gate electrode 19 will be examined.

The silicon oxide film 17 is formed by removing the thick silicon oxide films 16, 23 of several tens nm in thickness using a mask with an opening in area F in FIG. 1 and then performing thermal oxidation.

The thin silicon oxide film 17 must be formed on the n-type region 13 and directly under the floating-gate electrode 19. This causes a disadvantage: the floating-gate electrode 19 must be lengthened along the channel length by the sum of the amount of misalignment of the mask for forming the floating-gate electrode 19 from the mask for forming an opening in area F and the amount of misalignment of the mask for forming an opening in area F from the mask for forming the n-type region 13.

To sum up, the minimum dimension along the channel of the data storage MOS transistor MT in the memory cell is determined as shown in FIG. 3.

Specifically, the minimum dimension along the channel of the data storage MOS transistor MT is determined by the sum of the following:

The amount of alignment of the mask for forming the floating-gate electrode 19 and control electrode 20 from the mask for forming an opening in area F where the silicon oxide film 17 is to be formed (expressed by "a")

The length of area F where the silicon oxide film 17 is to be formed (expressed by "b")

The amount of misalignment of the mask for forming an opening in area F where the silicon oxide film 17 is to be formed from the mask for forming the n-type region 13 (expressed by "c")

The channel length of the data storage MOS transistor MT (expressed by "d")

The amount of misalignment of the mask for forming the n-type region 14 from the mask for forming the floating-gate electrode 19 and the control gate 20 (expressed by "e")

The memory cell of the structure shown in FIGS. 1 and 2 requires a lot of misalignments to be taken into account in designing, as compared with an ordinary MOS transistor having a self-aligning structure, and therefore has the disadvantage of resulting in larger memory cells.

Explained next will be the thickness of the gate oxide film of the data storage MOS transistor MT.

To withstand high voltages in a write operation or an erase operation, the gate oxide film of the select MOS transistor ST is several times as thick as the gate oxide film of a MOS transistor to which only an ordinary power-supply voltage (e.g., 5 V) is applied.

The gate oxide film of the data storage MOS transistor MT and the gate oxide film of the select MOS transistor ST are formed simultaneously. As a result, the gate oxide film of the data storage MOS transistor MT is as thick as the gate oxide film of the select MOS transistor ST.

To make the data storage MOS transistor MT smaller, it is necessary to make its gate oxide film as thin as possible. As mentioned above, the gate oxide film of the data storage MOS transistor MT is as thick as the gate oxide film of the select MOS transistor ST, that is, several times as thick as the gate oxide film of an ordinary MOS transistor. For this reason, the channel length of the data storage MOS transistor MT is larger than the channel length of an ordinary MOS transistor.

As described above, in the case of the memory cell shown in FIGS. 1 and 2, because a lot of misalignments have to be taken into account and a larger channel length is required, the cell area will become larger.

The potential of the floating gate when a high potential is applied to the drain region is determined by the capacitive coupling between the drain region and the floating gate. In the case of the memory cell of the above structure, the capacitive coupling between the drain region and the floating gate of the data storage MOS transistor MT varies according to the misalignment of the mask for forming the n-type region 13 from the mask for forming the floating-gate electrode 19. The variation in the capacitive coupling results in a variation in the amount of electrons released from the floating-gate electrode into the drain region.

Accordingly, this causes variations in the threshold voltage of the data storage MOS transistor MT after electrons have been released.

FIGS. 4 and 5 show a double structure of a conventional nonvolatile semiconductor memory device. FIG. 4 is a plan view of a conventional nonvolatile semiconductor memory device. FIG. 5 is a sectional view taken along line V–V'.

The conventional nonvolatile semiconductor memory device has been disclosed in Jpn. Pat. Appln. KOKAI Publication No. 63-84168.

With this conventional device, it is possible to solve the problem with the conventional device shown in FIGS. 1 and 2, that is, it is possible to suppress variations in the write characteristics of the memory cell due to mask misalignment.

As with the conventional device of FIGS. 1 and 2, the memory cell is composed of a data storage MOS transistor MT and a select MOS transistor ST, which are connected to each other in series.

Above the channel region 39 of the data storage MOS transistor MT, a first portion 40B of a floating-gate electrode is provided via a gate insulating film 37 of several tens nm in thickness.

On a partial surface of the drain region 33 of the data storage MOS transistor MT, a gate insulating film 36 of nearly 10 nm in thickness (much thinner than the gate insulating film 37) is provided. On the gate insulating film 36, a second portion 40A of the floating-gate electrode is provided.

Although the first portion 40B and second portion 40A of the floating-gate electrode are spaced apart, they are electrically connected to each other above a field region. On and above the first portion 40B and second portion 40A of the floating-gate electrode, an insulating film 42 and a control gate electrode 44 are provided. It is preferable that the shape of the control gate electrode 44 should be the same as that of the floating-gate electrode.

The source region of the select MOS transistor ST and the drain region of the data storage MOS transistor are made up of n-type regions 32, 33, 34 formed continuously at the surface of a p-type semiconductor substrate 30. The drain region of the select MOS transistor ST is made up of n-type regions 31, 32', and an n-type region 35 is the source region of the data storage MOS transistor MT.

In such a memory cell, too, the n-type region 33 is formed before the formation of the floating-gate electrode and control gate electrode, as with the conventional device of FIGS. 1 and 2.

In this case, the n-type region 33 is formed by implanting n-type impurities into area E of the substrate 30 enclosed by a dot-dash line in FIG. 4. On the other hand, the n-type regions 32', 32, 34 are formed in a self-aligning manner by implanting n-type impurities into the substrate 30 using the floating-gate electrodes 40A, 40B and control gate electrode 44 as a mask. The n-type regions 31, 35 are formed by implanting n-type impurities into the substrate 30 using a specific mask.

With this conventional device, there arises a misalignment of the mask for forming the floating-gate electrodes 40A, 40B and a misalignment of the mask for forming the n-type region 33.

In the case of this conventional device, however, even if such mask misalignments take place, this will cause no variations in the capacitive coupling between the n-type regions (drain region) 32 to 34 of the data storage MOS transistor MT and the floating-gate electrodes 40A, 40B.

The reason for this is that the capacitive coupling between the n-type regions (drain region) 32 to 34 and the floating-gate electrodes 40A, 40B is determined by the area of the portion where the n-type region (drain region) 33 overlaps with the second portion 40A of the floating-gate electrode and the area is constant regardless of mask misalignment.

Consequently, with the memory cell in the conventional device, the write characteristics of the memory cell will not vary due to mask misalignment.

Furthermore, with the conventional device, the n-type regions 34, 35 can be formed in a self-aligning manner using the floating-gate electrodes 40A, 40B and control gate electrode 44 as a mask. Therefore, it is not necessary to take into account a misalignment of the mask for forming the n-type regions 34, 35 and a misalignment of the masks for forming the floating-gate electrodes 40A, 40B and control gate electrode 44.

To sum up, in the memory cell in the conventional memory cell, the minimum dimension along the channel length of the data storage MOS transistor MT is shown in FIG. 6.

Specifically, the minimum dimension along the channel length of the data storage MOS transistor MT is determined by the sum of the following:

The length of the second portion 40A of the floating-gate electrode (expressed by "a")

The amount of misalignment of the mask for forming the n-type region 33 from the mask for forming the floating-gate electrodes 40A, 40B (expressed by "b" and "c")

The channel length of the data storage MOS transistor MT (expressed by "d")

However, when the minimum spacing (expressed by "e") in which the floating-gate electrode and control gate electrode (polysilicon) can be processed is greater than b+c, the minimum dimension is determined by a+d+e.

Hereinafter, the conventional device in FIGS. 1 and 2 is compared with the conventional device in FIGS. 4 and 5.

If a, b, c, and d in FIG. 3 are almost equal to c, a, b, and d in FIG. 6, the data storage MOS transistor MT of FIG. 6 can be made smaller by the length of e. As a result, with the conventional device of FIGS. 4 and 5, the dimensions of a memory cell can be made smaller than those of a memory cell in the conventional device of FIGS. 1 and 2.

However, in the memory cell in the conventional device of FIGS. 4 and 5, the thickness of the gate oxide film 37 of the data storage MOS transistor MT is larger. Accordingly, the channel length of the data storage MOS transistor MT is larger, so that the area of the memory cell cannot be made much smaller than that of the memory cell in the conventional device of FIGS. 1 and 2.

To overcome this shortcoming, a third structure of a conventional nonvolatile semiconductor memory device has been proposed in John R. Yeargain & Clinton Kuo, "A High Density Floating-Gate EEPROM Cell," IEDM Technical Digest, December, 1981.

FIG. 7 shows a third structure of a conventional nonvolatile semiconductor memory device. FIG. 8 is a sectional view taken along line VIII–VIII' of FIG. 7.

The memory cell is composed of a data storage MOS transistor MT and a select MOS transistor ST, which are connected to each other in series.

The source region of the select MOS transistor ST and the drain region of the data storage MOS transistor MT are composed of an n-type region 52 formed at the surface of a p-type semiconductor substrate 50. On the entire surface of the channel region 57 of the data storage MOS transistor MT, a thin silicon oxide film 54 of nearly 10 nm in thickness is formed. On the thin silicon oxide film 54, a floating-gate electrode 58 made of polysilicon is formed. On and above the floating-gate electrode 58, an insulating film 60 and a control gate electrode 61 are formed.

Directly under a gate electrode 59 of the select MOS transistor ST, an insulating film much thicker than the silicon oxide film 54, for example, a silicon oxide film 55 of nearly several tens nm in thickness, is formed.

The drain region of the select MOS transistor ST is composed of n-type regions 51, 52', and an n-type region 53 is the source region of the data storage MOS transistor MT.

With the memory cell of such a structure, the erasing of data is performed by applying a high potential to the control gate electrode 61 of the data storage MOS transistor MT. Once a high potential has been applied to the control gate electrode 61 of the data storage MOS transistor MT, Fowler-Nordheim tunneling allows electrons to move from the n-type region (drain region) 52, channel region 57, and n-type region (source region) 53 via the silicon oxide film 54 to the floating-gate electrode 58.

The writing of data is performed by applying a high potential to the n-type region (drain region) 51 and gate electrode 59 of the select MOS transistor ST, and 0 V to the control gate electrode 61 of the data storage MOS transistor MT. As a result, the n-type region (drain region) 52 of the data storage MOS transistor MT are at a high potential, so that the tunnel effect allows electrons to move from the floating-gate electrode 58 to the n-type region (drain region) 52 via the silicon oxide film 54.

with the structure of the memory cell, the n-type regions 52', 52, 53 are formed in a self-aligning manner using the gate electrode 59 of the select MOS transistor ST, the floating-gate electrode 58 and control gate 61 of the data storage MOS transistor MT as masks, respectively.

The thin silicon oxide film 54 is formed on the entire surface of the channel region of the data storage MOS transistor MT.

Therefore, unlike the conventional device of FIGS. 1 and 2 and that of FIGS. 4 and 5, it is not necessary to take into account the misalignment of the mask for forming the n-type regions 52', 52, 53 from the mask for forming the floating-gate electrode and the misalignment of the mask for specifying an area in which a silicon oxide film is to be formed from the mask for forming the floating-gate electrode.

Since the gate oxide film of the data storage MOS transistor MT is as thin as nearly 10 nm, the channel length can be made very small.

For the reasons described above, the area of the memory cell is much smaller than that in the conventional device of FIGS. 1 and 2 and that in the conventional device of FIGS. 4 and 5.

It is known that in a MOS device with a thin oxide film, a breakdown phenomenon takes place due to band-to-band tunneling. The phenomenon has been described in detail in R. Shirota, T. Endoh, M. Momodomi, R. Nakayama, S. Inoue, R. Kirisawa & F. Masuoka, "An Accurate Model of Subbreakdown due to Band-to-Band Tunneling and its Application," IEDM, 1988.

The phenomenon will be explained briefly.

For instance, with an n-channel MOS transistor, when a voltage higher than the gate voltage is applied to its source or drain, a depletion layer at the surface of the source or drain overlapping with the gate electrode expands. The phenomenon of electrons tunneling from the valence band to the conduction band, or what is called a band-to-band tunneling phenomenon, has occurred, and at the surface, electrons and holes are generated. Then, as the electrons move to the drain and the holes move to the substrate, thus, a substrate current develops.

In a conventional device in FIGS. 7 and 8, a thin oxide film 54 is formed on the entire surface of the channel region of a data storage MOS transistor MT.

As shown in FIG. 9, when a high potential is applied to the n-type region (drain region) of the data storage MOS transistor MT in a write operation, a depletion layer at the surface of the n-type region (drain region) 52 overlapping with a floating-gate electrode 58 expands, allowing a substrate current Is to flow through band-to-band tunneling.

On the other hand, with the conventional device of FIGS. 1 and 2, as shown in FIG. 10, the gate oxide film 23 of the data storage MOS transistor MT is as thick as several tens nm, and one end of the n-type region (drain region) of the data storage MOS transistor MT is under the thick gate oxide film 23.

This prevents the depletion layer at the surface at the end of the n-type region (drain region) 13 from expanding further. Because the depletion layer at the surface acts as a potential barrier, the holes generated at the surface at the end of the n-type region 13 do not move to the substrate, and a substrate current due to band-to-band tunneling does not flow.

In the conventional device of FIGS. 4 and 5, a substrate current will not develop because of similar reasons.

In a nonvolatile semiconductor memory device which electrically write and erase data, high potentials necessary for a write operation and an erase operation are generated at the step-up circuit in the LSI, in some cases.

With the device of FIGS. 7 and 8, since a large substrate current develops during a write operation, it is difficult to cause the step-up circuit in the LSI to supply a high potential (a write current). Especially, at the time of a page rewrite operation in which data should be written into many memory cells. The writing of data may not be carried out.

A substrate current during a write operation increases the power consumption in the LSI. Therefore, in the case of an LSI required to be less power-consuming, such as a battery-powered LSI, the generation of substrate current is not desirable. That is, the conventional device of FIGS. 7 and 8 has the following disadvantage: although the cell area can be made very small, a substrate current flows due to band-to-band tunneling in a write operation, thus preventing a high potential from being generated within the LSI, with the result that a less power-consuming operation cannot be achieved.

As described above, the conventional nonvolatile semiconductor memory devices have disadvantages in that when they are designed to make smaller the drawn current during a write operation, the area of the memory cell becomes larger, and in that, conversely, when they are designed to make the area of the memory cell much smaller, the drawn current during a write operation becomes larger.

SUMMARY OF THE INVENTION

Accordingly, the object of the present invention is to provide a nonvolatile semiconductor memory device the area of whose memory cell is small and in which the drawn current during a write operation is small, thereby enabling high integration of memory cells, a step-up operation in the LSI, and a less power-consuming operation.

The foregoing object is accomplished by providing a nonvolatile semiconductor memory device comprising: a semiconductor substrate with an element region and a field region; a select MOS transistor formed in the element region; and a data storage MOS transistor formed in the element region.

The data storage MOS transistor contains a source region, a drain region, a floating-gate electrode, and a control gate electrode. The floating-gate electrode is composed of a first portion above the drain region and a second portion above the semiconductor substrate between the source region and the drain region. Between the drain region and the first portion and between the semiconductor substrate and the second portion, only an insulating film thinner than a gate insulating film of the select MOS transistor is placed. The first portion and the second portion are spaced apart above the element region and connected to each other on the field region.

The drain region of the data storage MOS transistor contains: a first region which is placed in a region including a place directly under the first portion, and one end of which is on the bottom of a spacing between the first portion and the second portion; and a second region one end of which is placed on the side of the second portion, and the other end of which is connected to one end of the first region, and whose impurity concentration is set more than several times lower than the impurity concentration in the first region.

The first region is composed of impurities of more than two types whose diffusion coefficient differs from each other. The impurities whose diffusion coefficient is lower than the remaining ones of the impurities of more than two types determine the impurity concentration at the surface of the drain region of the data storage MOS transistor, and the impurities whose diffusion coefficient is higher than the remaining ones of the impurities of more than two types extend to directly under the field region.

A method of manufacturing nonvolatile semiconductor memory devices according to the present invention, comprises the following steps:

First, a first region is formed by implanting impurities of a second conductivity type into an element region of a semiconductor substrate of a first conductivity type, and a first insulating film is formed in the element region.

Then, the first insulating film on the first region and a region adjacent to the first region is removed, and a second insulating film thicker than the first insulating film is formed on the semiconductor substrate exposed in the element region.

Then, a first conducting film is formed on the entire surface of the semiconductor substrate, a slit-like hole is formed in a specified position of the first conducting film, a third insulating film is formed on the entire surface of the semiconductor substrate, and a second conducting film is formed on the third insulating film.

Thereafter, the second conducting film, the third insulating film, the first conducting film, the second insulating film, and the first insulating film are etched in sequence, so as to form a gate electrode of the select MOS transistor and a control gate electrode and a floating-gate electrode of the data storage MOS transistor. The control gate electrode and the floating-gate electrode have a first portion and a second portion above the element region. The first portion is placed above the first region. The first portion and the second portion are spaced apart on the element region and connected to each other on a field region.

Next, impurities of a second conductivity type are implanted into the element region with the gate electrode of the select MOS transistor and the control gate electrode and floating-gate electrode of the data storage MOS transistor as a mask, so as to form a second region in the element region between the first portion and the second portion and a third region in the element region between the first portion and the gate electrode of the select MOS transistor.

With the above-described configuration, an insulating film much thinner than the gate insulating film of the select MOS transistor directly under the first portion and second portion of the floating-gate electrode.

Because of this, the channel length of the data storage MOS transistor can be shortened. Since the first and second portions of the floating-gate electrode are spaced apart, an impurity region for determining the channel length of the data storage MOS transistor can be formed in a self-aligning manner. Therefore, the memory cell can be made smaller.

Furthermore, the drain region of the data storage MOS transistor contains the first region formed directly under the first portion of the floating-gate electrode and the second region formed between the first region and the second portion of the floating-gate electrode. The impurity concentration in the second region is more than several times lower than that in the first region.

As a result, a substrate current can be prevented at one end of the drain region along the channel length of the data storage MOS transistor during a write operation. Namely, only a write current is allowed to flow, resulting in a smaller drawn current.

Additionally, the first region is composed of impurities of more than two types whose diffusion coefficient differs from each other. The impurities whose diffusion coefficient is lower determines the impurity concentration at the surface of the drain region, and the impurities whose diffusion coefficient is higher extends to directly under the field region.

Consequently, a substrate current can be prevented at one end of the drain region across the channel width of the data storage MOS transistor during a write operation. Namely, only a write current is allowed to flow, resulting in a smaller drawn current.

As described above, not only can a smaller memory cell area and a lower drawn current in a write operation be achieved, but a step-up operation within the LSI and a lower power-consuming operation can also be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a plan view of a conventional nonvolatile semiconductor memory device;

FIG. 8 is a sectional view taken along line VII–VII' of FIG. 7;

FIG. 9 is a view of an expanse of a depletion layer in the drain region during a write operation in the device of FIG. 7;

FIG. 10 is a view of an expanse of a depletion layer in the drain region during a write operation in the device of FIG. 1;

FIG. 11 is a plan view of a nonvolatile semiconductor memory device according to the present invention;

FIG. 12 is a sectional view taken along line XII–XII' of FIG. 11;

FIG. 13 is a sectional view taken along line XIII–XIII' of FIG. 11;

FIG. 14 is a sectional view of the data storage MOS transistor in the device of FIG. 11;

FIG. 15 is a view of an expanse of a depletion layer in the drain region during a write operation in the device of FIG. 11;

FIG. 16 shows the relationship between drain voltage $V_D$, write current $I_R$, and substrate current Is in FIG. 11;

FIG. 20 is a plan view of a process in a method of manufacturing nonvolatile semiconductor memory devices according to the present invention;

FIG. 21 is a sectional view taken along line XXI–XXI' of FIG. 20;

FIG. 22 is a sectional view taken along line XXII–XXII' of FIG. 20;

FIG. 23 is a plan view of a process in a method of manufacturing nonvolatile semiconductor memory devices according to the present invention;

FIG. 24 is a sectional view taken along line XXIV–XXIV' of FIG. 23;

FIG. 25 is a sectional view taken along line XXV–XXV' of FIG. 23;

FIG. 29 is a plan view of a process in a method of manufacturing nonvolatile semiconductor memory devices according to the present invention;

FIG. 30 is a sectional view taken along line XXX–XXX' of FIG. 29;

FIG. 31 is a sectional view taken along line XXXI–XXXI' of FIG. 29;

FIG. 32 is a view of an expanse of a depletion layer in the drain region during a write operation in the device of FIG. 11; and FIG. 33 is a view of an expanse of a depletion layer in the drain region during a write operation in the device of FIG. 11.

DETAILED DESCRIPTION OF THE PREFERRED EMBODIMENTS

Figure 1:
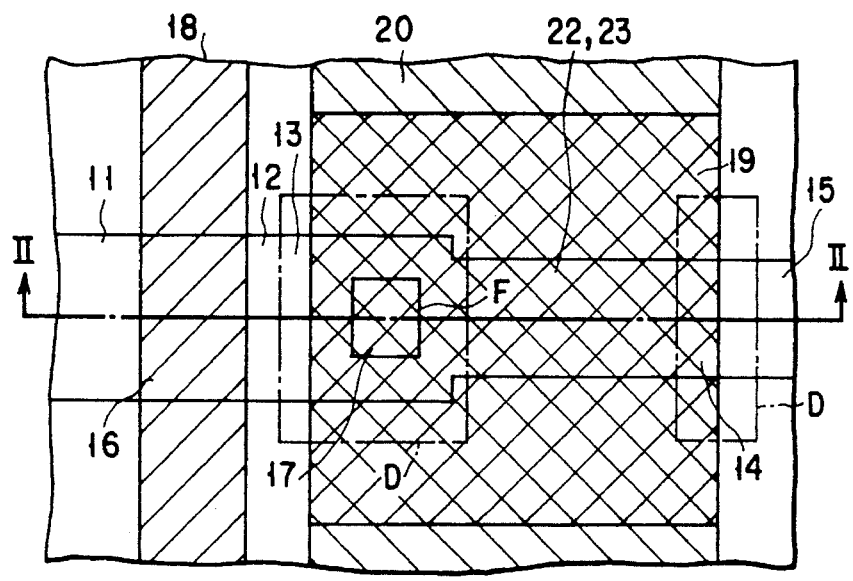
FIG. 1 is a plan view of a conventional nonvolatile semiconductor memory device.

Hereinafter, referring to the accompanying drawings, a nonvolatile semiconductor memory device according to the present invention will be explained in detail.

FIGS. 11 to 13 show the main portion of a nonvolatile semiconductor memory device of the present invention. FIG. 11 is a plan view of the structure of a memory cell used in the nonvolatile semiconductor memory device of the invention. FIG. 12 is a sectional view taken along line XII–XII'. FIG. 13 is a sectional view taken along line XIII–XIII'.

The memory cell is composed of a select MOS transistor ST and a data storage MOS transistor MT with a floating-gate electrode and a control gate electrode, these two transistor being connected to each other in series.

Numeral 60 is a p-type silicon semiconductor substrate, for example. The surface region of the substrate 60 is made up of an SDG region (source, drain, and gate regions) and a field region. In the SDG region of the substrate 60, n-type regions 61, 62', 62, 63, 64, 65 and channel regions 69, 70 are formed.

On the field region of the substrate 60, a very thick silicon oxide film 76 is formed. The n-type regions 61, 62' constitute the drain region of the select MOS transistor ST. The n-type regions 62, 63, 64 constitute the source region of the select MOS transistor ST and the drain region of the storage MOS transistor MT. These n-type regions 62, 63, 64 are arranged continuously in a line. The n-type region 65 is the source region of the data storage MOS transistor MT.

First, the impurity concentration in the n-type regions 62, 63, 64 will be explained.

The impurity concentration in the n-type region 64 is set lower than that in the n-type region 63. For instance, the difference in impurity concentration between the n-type regions 63 and 64 is set at more than several times. Therefore, when the dosage of the n-type region 63 is approximately $5 \times 10^{13}$ cm$^{-2}$, the dosage of the n-type region 64 is set at approximately $1 \times 10^{13}$ cm$^{-2}$.

The impurity concentration in the n-type region 62 is not limited to a specific value or a specific range. That is, even if the impurity concentration in the n-type region 62 takes any value, the memory cell operates properly. Since making the impurity concentration in the n-type region 62 equal to that in the n-type region 64 enables the n-type region 62 and the n-type region 64 to be formed simultaneously, this helps reduce the number of manufacturing processes.

Explanation of the thin silicon oxide film 66 will be given.

On a part of the substrate where area A indicated by a dot-dash line overlaps with the SDG region as shown in FIG. 11, a very thin silicon oxide film 66 of nearly 10 nm in thickness is formed. The silicon oxide film 66 is formed on the most surface or the entire surface of the n-type region 63, on the n-type region 64, and on the substrate 60 between the n-type region 64 and the n-type region 65 (on the channel region 70 of the data storage MOS transistor MT).

The silicon oxide film 66 serves not only as a path through which electrons pass during a write operation or an erase operation, but also as a gate insulating film of the data storage MOS transistor MT.

On the remaining area of the SDG region where the silicon oxide film 66 has not been formed, a silicon oxide film 68 of several tens nm in thickness is formed. The silicon oxide film 68 functions as a gate oxide film of the select MOS transistor ST.

On the n-type region 63 and on the channel region 70 of the data storage MOS transistor MT, the silicon oxide film 66 and the floating-gate electrode 71 are formed. The floating-gate electrode 71 is formed into a shape with a slit-like opening in its center.

Specifically, in the SDG region, the floating-gate electrode 71 is made up of a first portion 71A and a second portion 71B. The first portion 71A and the second portion 71B are electrically connected to each other on the field region.

To sum up, the thin silicon oxide film 66 is formed at least on a part of the. substrate 60 where the SDG region overlaps with the first and second portions 71A, 71B of the floating-gate electrode. Only the silicon oxide film 66 directly under the first portion 71A of the floating-gate electrode acts as a tunnel insulating film, whereas only the silicon oxide film 66 directly under the second portion 71B of the floating-gate electrode acts as a gate insulating film.

On and above the channel region 69 of the select MOS transistor ST, the silicon oxide film 68 of nearly several tens nm in thickness and a gate electrode 72 made of polysilicon are formed.

On and above the floating-gate electrode 71, an insulating film 74 of several tens nm in thickness and a control gate electrode 75 made of polysilicon are formed. The insulating film 74 consists of a silicon oxide film, a silicon nitride film, or a laminate film of these films (e.g., an ONO film), for example. It is preferable that the shape of the control gate electrode 75 should be almost equal to the shape of the floating-gate electrode 71 in the direction in which the drain and source are arranged.

On and above the gate electrode 72 of the select MOS transistor ST, an insulating film 74 and a gate electrode 73 made of polysilicon are formed. The gate electrode 72 and the gate electrode 73 are electrically connected to each other. The gate electrode 72 virtually functions as the gate electrode of the select MOS transistor ST.

The reason why the select MOS transistor ST has a double-layered gate electrode is to form the floating-gate electrode and control electrode of the data storage MOS transistor MT and the gate electrode of the select MOS transistor ST in the same process at the same time. The two-layered gate electrode of the select MOS transistor ST has the effect of simplifying the manufacturing processes. It should be noted that even if the gate electrode of the select MOS transistor ST is designed to have a single-layer structure, the memory cell will operate properly.

Explained next will be the dimension along the channel length of the data storage MOS transistor MT in the memory cell thus constructed.

As shown in FIG. 14, the dimension along the channel length of the data storage MOS transistor MT is determined by the sum of the following:

The length of the first portion of the floating-gate (expressed by "a")

The amount of misalignment of the mask for forming the n-type region 63 from the mask for forming the floating-gate (expressed by "b" and "c")

The channel length of the data storage MOS transistor MT (expressed by "d")

When the minimum spacing "e" where the floating-gate electrode and control gate electrode (polysilicon) can be processed is larger than the sum of b and c, the dimension is determined by the sum of a, d, and e.

For the memory cell of the invention, the n-type region 64 and n-type region 65 that determine the channel length of the data storage MOS transistor MT are formed in a self-aligning manner using the floating-gate electrode 71 and control gate electrode 75 as a mask. Therefore, with the invention, the problem with the conventional device of FIGS. 1 and 2 can be avoided. Specifically, it is not necessary to take into account the misalignment of the mask for forming the n-type region (source region) 65 of the data storage MOS transistor MT from the mask for forming the floating-gate electrode 71. Therefore, the memory cell can be made smaller by the amount of mask misalignment.

Explained next will be the channel length "d" of the data storage MOS transistor MT.

The thickness of the gate oxide film of the data storage MOS transistor MT in the conventional devices in FIGS. 1 and 2 and FIGS. 4 and 5 is nearly several tens nm, whereas the thickness of the gate oxide film of the data storage MOS transistor MT in the memory cell in FIGS. 11 to 13 is nearly 10 nm.

Figure 2:
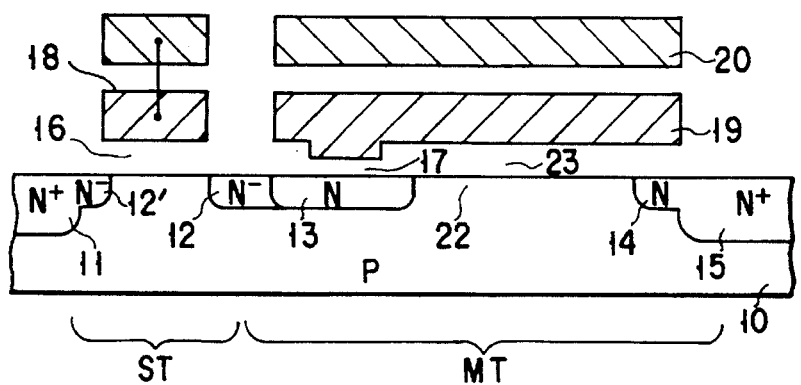
FIG. 2 is a sectional view taken along line II–II' of FIG. 1.
Figure 3:
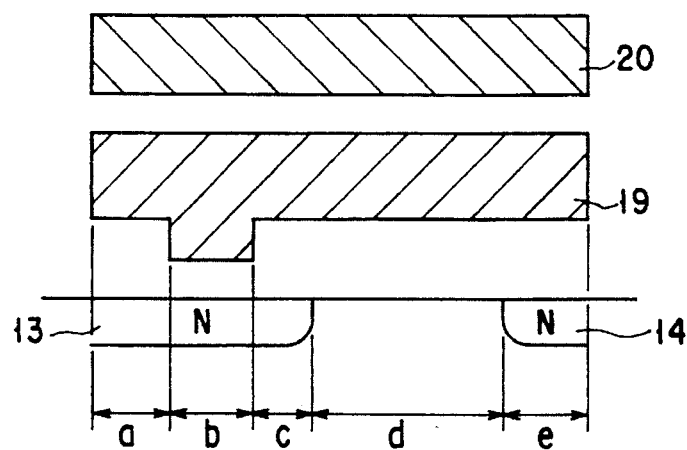
FIG. 3 is a sectional view of the data storage MOS transistor in the device of FIG. 2.
Figure 4:
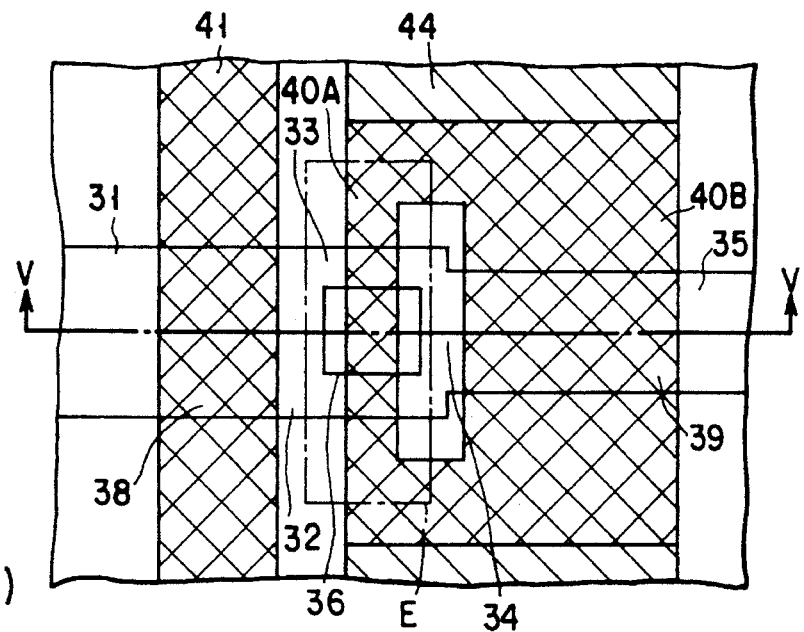
FIG. 4 is a plan view of a conventional nonvolatile semiconductor memory device.
Figure 5:
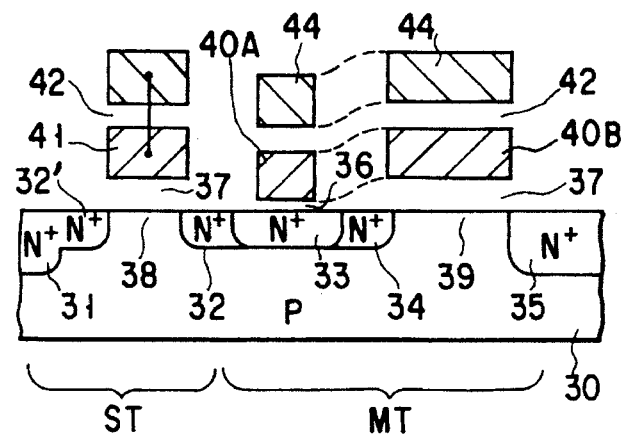
FIG. 5 is a sectional view taken along line V–V' of FIG. 4.
Figure 6:
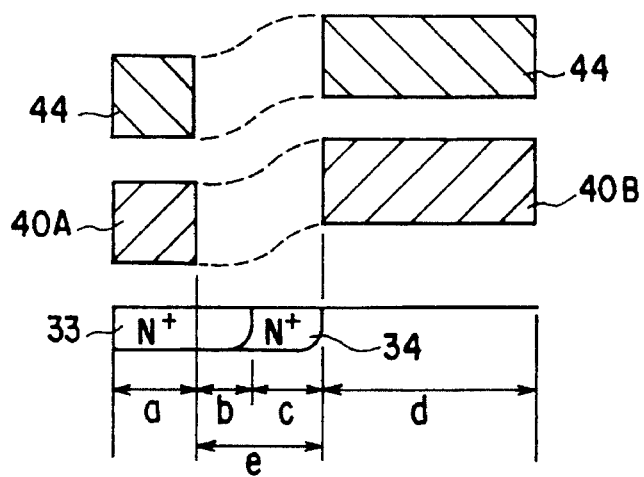
FIG. 6 is a sectional view of the data storage MOS transistor in the device of FIG. 4.

Therefore, according to the reduction rules of the MOS transistor, the channel length can be theoretically made several times shorter than that in the conventional device of FIGS. 1 and 2 or of FIGS. 4 and 5. Namely, since the channel length which accounts for the largest percentage of the factors determining the dimension along the channel length of the data storage MOS transistor MT, can be reduced, the area of the memory cell can be made much smaller.

Explained next will be the dimension across the channel width of the data storage MOS transistor MT.

In the conventional device of FIGS. 1 and 2 and in that of FIGS. 4 and 5, a very thin silicon oxide film is formed on a partial surface of the drain region of the data storage MOS transistor MT. Consequently, the width of the SDG region is inevitably made larger by the amount of misalignment of the mask for making an opening to form a silicon oxide film from the mask for forming the SDG region.

With the present invention, however, on the entire surface of the drain region of the data storage MOS transistor MT and on the entire part of the channel, a very thin silicon oxide film is formed. Therefore, the width of the SDG region can be made smaller by the amount of mask misalignment.

The spacing between adjacent SDG regions is determined by the withstand voltage between them. Therefore, reducing the dimension of the memory cell across the channel width decreases the spacing between adjacent SDG regions, thereby contributing to high integration of memory cells.

Examined next will be a substrate current in a write operation.

With the present invention, as shown in FIG. 15, there is a slit-like opening on the edge of the n-type region 63 of high impurity concentration. That is, neither the floating-gate electrodes 71A, 71B nor the control gate electrode 75 exist above the edge.

Consequently, since the depletion layer does not spread much at the edge of the n-type region 63 at the surface of the substrate, a substrate current due to band-to-band tunneling as described in the conventional device of FIGS. 7 and 8 will not flow at the surface of the substrate.

On the other hand, since above the edge of the n-type region 64, the floating-gate electrode 71B exists, a substrate current develops. The impurity concentration in the n-type region 64 is much lower than that in the n-type region 63 (several times lower than the latter). Accordingly, the curve of the band at the edge of the n-type region 64 at the surface of the substrate is gentle, with the result that a substrate current due to band-to-band tunneling is very small.

By making the impurity concentration in the n-type region 63 as high as possible, the depletion layer at the surface of the n-type region 63 can be prevented from expanding. This makes larger the effective electric field between the drain region and the floating-gate electrode, resulting in an increase in the write current due to the tunnel effect. As a result, the writing or erasing of data can be effected easily.

Even if the impurity concentration in the n-type region 63 is made higher, a substrate current due to band-to-band tunneling does not increase as described above.

On the other hand, by making the impurity concentration in the n-type region 64 as low as possible, a tunnel current between bands decreases, thereby contributing to the reduction of power consumption. Since the write current depends on the impurity concentration in the n-type region 63, the write current will not decrease even if the impurity concentration in the n-type region 64 is made lower.

As described above, since the write current depends only on the impurity concentration in the n-type region 63, and the substrate current depends only on the impurity concentration in the n-type region 64, the impurity concentration in the n-type region 63 and that in the n-type region 64 can be set at the respective optimum values. Furthermore, by setting the impurity concentration in the n-type regions 63 and 64 at the optimum values, the drain voltage at which a write current starts to flow can be set lower than the drain voltage at which a substrate current starts to flow.

Explained next will be the relationship between drain voltage $V_D$, write current $I_R$, and substrate current $I_S$ in the data storage MOS transistor MT.

According to the present invention, by setting the impurity concentration in the n-type regions 63 and 64 at the optimum values, almost no substrate current is allowed to flow during a write operation.

Figure 17:
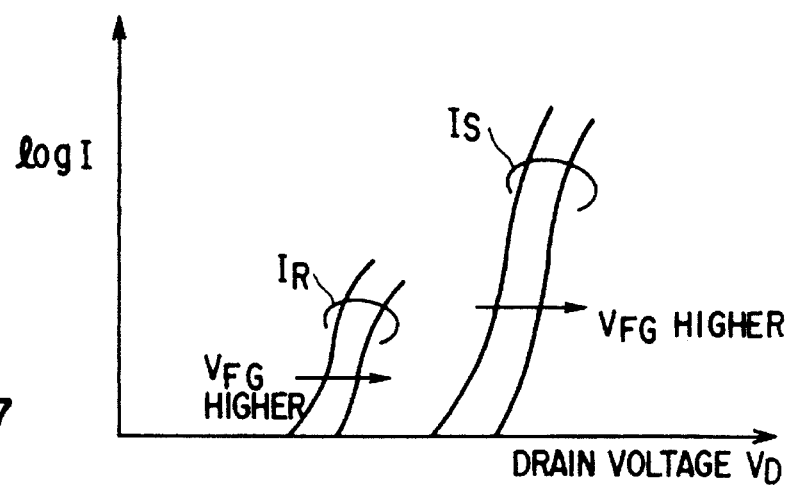
FIG. 17 shows the relationship between drain voltage $V_D$, write current $I_R$, and substrate current Is in FIG. 11.

As shown in FIGS. 16 and 17, as the drain region $V_D$ is raised, the write current $I_R$ first flows from the drain region 63 to the floating-gate electrode 71 by the FN tunnel effect.

At this time, in the drain region $V_D$, almost no current Is flows because of the difference in impurity concentration between the n-type regions 63 and 64. As the write current $I_R$ flows, the potential of the floating-gate electrode 71 rises gradually, with the result that the potential difference between the floating-gate electrode 71 and the drain region 63 decreases gradually.

The smaller the potential difference between the floating-gate electrode 71 and the drain region 63, the more the write current $I_R$ due to band-to-band tunneling reduces. Therefore, the rise of the potential $V_{FG}$ at the floating-gate electrode 71 leads to the rise of the drain voltage $V_D$ necessary for the write current $I_R$ to flow. At the same time, however, the drain voltage $V_D$ at which a substrate current Is begins to flow rises as well, preventing the substrate current Is from flowing.

As described above, raising the drain voltage $V_D$ allows sufficient write current Is to flow. The rise of the voltage VFG at the floating-gate electrode 71 results in the rise of the drain voltage $V_D$ at which the substrate current Is starts to flow. In the end, data can be written and erased just by flowing almost no substrate current Is.

Figure 18:
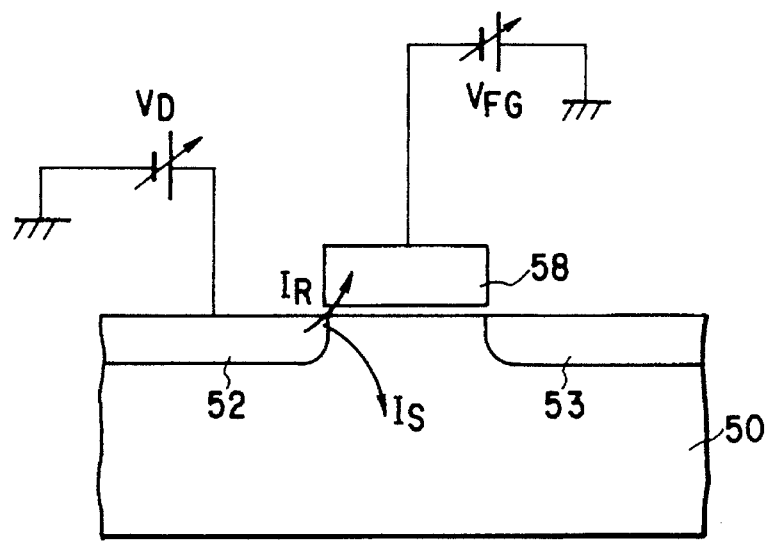
FIG. 18 shows the relationship between drain voltage $V_D$, write current $I_R$, and substrate current Is in FIG. 7.
Figure 19:
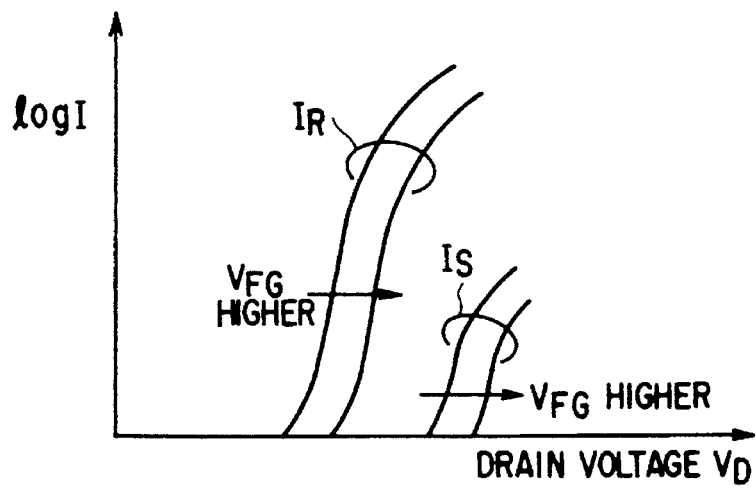
FIG. 19 shows the relationship between drain voltage $V_D$, write current $I_R$, and substrate current Is in FIG. 7.

In contrast, with the conventional device of FIGS. 7 and 8, as the drain voltage $V_D$ is raised as shown in FIGS. 18 and 19, the substrate current Is first starts to flow. Therefore, to write data by flowing a write current $I_R$, the drain voltage $V_D$ must be raised further, resulting in higher power consumption.

Additionally, the write current $I_R$ and substrate current Is depend only on the impurity concentration in the drain region (n-type region) 52. As a result, the increase of the impurity concentration in the drain region 52 increases both the write current $I_R$ and the substrate current Is, whereas the decrease of the impurity concentration in the drain region 52 decreases both the write current $I_R$ and the substrate current Is.

Therefore, even if the n-type impurity concentration in the drain region 52 is changed in any way, the ratio of the write current $I_R$ to the substrate current Is hardly changes with respect to the drain voltage $V_D$.

Normally, with the conventional device of FIGS. 7 and 8, the drain voltage $V_D$ at which the write current $I_R$ starts to flow is higher than the drain voltage $V_D$ at which the substrate current Is starts to flow. Therefore, as the drain voltage $V_D$ is raised, the substrate current Is first starts to flow.

Furthermore, when the drain voltage $V_D$ is generated by an internal step-up circuit provided in the LSI, the substrate voltage reaches the voltage at which the substrate current Is balances with the current supplied from the internal step-up circuit, the rise of the drain voltage $V_D$ stops.

Consequently, when the maximum value of the drain voltage is lower than a voltage high enough for the write current $I_R$ to start to flow, this prevents the floating-gate potential $V_{FG}$ from rising, making it impossible to write data. When a high voltage is supplied from an external power supply, a very large substrate current Is flows during a write operation, making it difficult to perform a low power-consuming operation.

Furthermore, when a large substrate current Is develops during a write operation, this causes disadvantages such as hot carriers being injected into the oxide film, degrading the reliability of the memory cells. Namely, a memory cell that generates a large substrate current Is as in the conventional device of FIGS. 7 and 8, cannot improve the reliability.

However, with the present invention, by setting the impurity concentration in the n-type regions optimally, the substrate current Is during a write operation can be reduced to almost zero. Furthermore, not only an internal step-up operation but also a low power-consuming operation can be performed, thereby realizing a highly reliable memory cell.

In the embodiment, in the field regions on the right and left sides of the SDG region, the floating-gate electrodes 71A and 71B are connected to each other. However, in the field region only on one side of the SDG region, the floating-gate electrodes 71A and 71B may be connected to each other. In this case, the floating-gate electrode is formed into a U shape.

Hereinafter, a method of manufacturing nonvolatile semiconductor memory devices according to the present invention will be described.

As shown in FIGS. 20 to 22, a field oxide film 76 is formed on a p-type silicon substrate 60, and a SDG region and a field region are set. A silicon oxide film (not shown) formed on the SDG region. Using a mask with an opening in area B enclosed by a dot-dash line, n-type impurities are implanted into the substrate 60 to form a n-type region 63 in the region where area B overlaps with the SDG region. The silicon oxide film is removed.

A silicon oxide film 68 of nearly several tens nm in thickness is formed on the entire surface of the SDG region of the substrate 60. Thereafter, using a mask with an opening in area A enclosed by a dot-dash line, the silicon oxide film 68 in the region where area A overlaps with the SDG region, is removed. On the region of the substrate where the silicon oxide film 68 has been removed, another thin silicon oxide film 66 of approximately 10 nm in thickness is formed.

Next, as shown in FIGS. 23 to 25, on the entire surface of the substrate 60, a first polysilicon layer 71' is deposited. Then, using a mask with a slit-like opening in area C enclosed by a dot-dash line, the first polysilicon layer is selectively removed.

Figure 26:
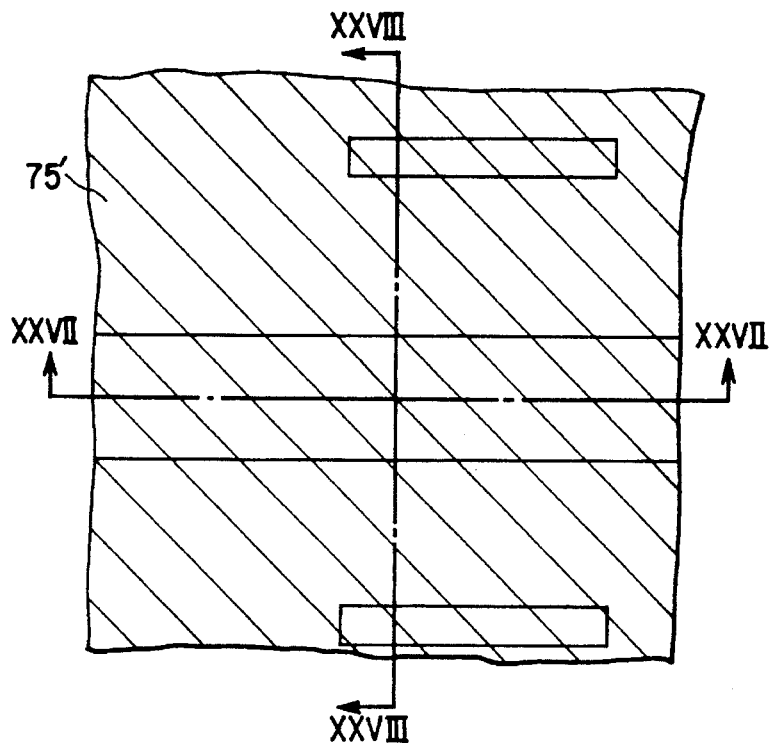
FIG. 26 is a plan view of a process in a method of manufacturing nonvolatile semiconductor memory devices according to the present invention.
Figure 27:
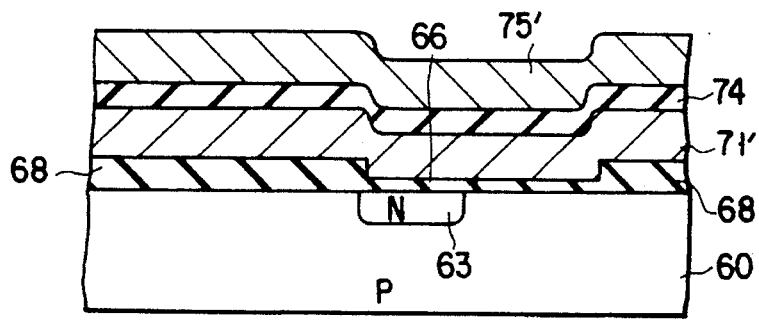
FIG. 27 is a sectional view taken along line XXVII–XXVII' of FIG. 26.
Figure 28:
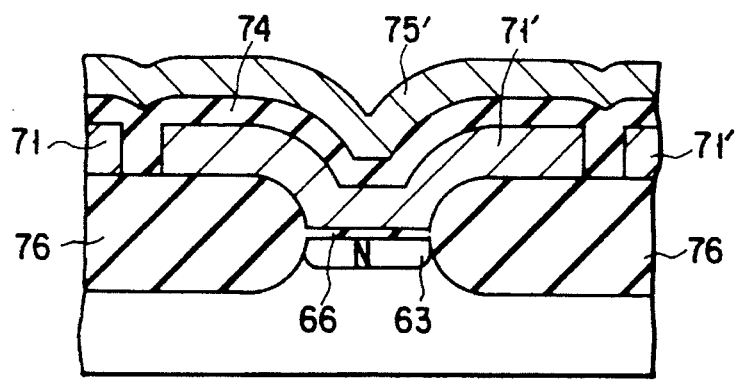
FIG. 28 is a sectional view taken along line XXVIII–XXVIII' of FIG. 26.

Next, as shown in FIGS. 26 to 28, on the entire surface of the substrate 60, an insulating film 74 of nearly several tens nm in thickness is formed. Then, on the insulating film 74, a second polysilicon layer 75' is deposited.

Then, as shown in FIGS. 29 to 31, using a specific mask, the second polysilicon layer 75', the insulating film 74, and the first polysilicon layer 71' are etched consecutively to form floating-gate electrodes 71A, 71B, a control gate electrode 75, and two layers of gate electrodes 72, 73 for each memory cell in a selfaligning manner.

Thereafter, using the control gate electrode 75 and the gate electrode 73 as a mask, n-type impurities are implanted into the substrate 60 to form n-type regions 62, 62', 64 in a self-aligning manner. At this time, the n-type regions 62, 64 are connected to the n-type region previously formed.

Additionally, using a specific mask, n-type impurities are implanted into the substrate 60 to form n-type regions 61, 65.

In this way, a memory cell in a nonvolatile semiconductor memory device is completed.

With this method, the n-type regions 62, 62', 64 are formed simultaneously in a self-aligning manner. This not only reduces the number of manufacturing processes, but also eliminates the necessity of taking mask misalignment into account. Furthermore, in the method, the impurity concentration in the n-type regions 62, 62' is equal to that in the n-type region 64. If it is desired that the impurity concentration in the n-type regions 62, 62' differ from that in the n-type region 64, the n-type regions 62, 62' have only to be formed independently from the n-type region 64, using a specific mask.

FIG. 32 is a detailed sectional view taken along line XIII–XIII' of FIG. 11.

In the embodiment, to shorten the channel length of the data storage MOS transistor MT, the very thin silicon oxide film 66 is formed on the entire surface of the SDG region overlapping with the floating-gate electrode 71.

However, if the n-type region 63 is formed of only n-type impurities of a single type, the following drawback will arise:

If the n-type region 63 is formed of only n-type impurities of a single type, the end of the drain region across the channel width of the data storage MOS transistor MT will be positioned directly under the very thin silicon oxide film 66.

Accordingly, when writing is done by applying a high potential to the drain region 63 of the data storage MOS transistor MT and 0 V to the control gate electrode 75, a depletion layer at the end of the drain region 63 expands as shown in FIG. 32, allowing a substrate current Is to flow by band-to-band tunneling at the end of the drain region 63 or at the boundary between the SDG region and the field region.

To overcome this drawback, the n-type region 63 is formed of n-type impurities of more than two types whose diffusion coefficient differs from each other, for example, arsenic (As), whose diffusion coefficient is low, and phosphorus (P), whose diffusion coefficient is high.

In this case, a sectional view taken along line XIII–XIII' of FIG. 11 is given in FIG. 33.

Specifically, the end of the n-type region 63' formed of n-type impurities whose diffusion coefficient is high (e.g., phosphorus) is positioned directly under the very thick field oxide film 76.

With such a structure, since the end of the drain region across the channel width of the data storage MOS transistor MT is positioned directly under the very thick field oxide film 76, a depletion layer at the end of the drain region (n-type region) 63, 63' does not spread much, preventing a substrate current due to band-to-band tunneling from flowing.

Furthermore, in the embodiment, the impurity concentration at the surface necessary for the drain region of the data storage MOS transistor MT is maintained by n-type impurities whose diffusion coefficient is low, and the position of the end of the drain region is controlled by n-type impurities whose diffusion coefficient is high. Therefore, the write characteristics can be improved by using n-type impurities whose diffusion coefficient is low, and a substrate current can be prevented using n-type impurities whose diffusion coefficient is high.

Forming such a structure out of n-type impurities of a single type whose diffusion coefficient is high (e.g., phosphorus) makes difficult the setting of the impurity concentration at the surface of the drain region, or the control of the position of the drain region's end.

Specifically, an attempt to optimize the impurity concentration at the surface of the drain region permits the drain region to penetrate the channel portion of the data storage MOS transistor, for example. An attempt to limit the extension of the drain region due to diffusion lowers the impurity concentration at the surface of the drain region, resulting in an insufficient write current.

As explained above, the method of manufacturing nonvolatile semiconductor memory devices according to the invention produces the following effects.

Since a very thin silicon oxide film is formed on the drain region and the channel region of the data storage MOS transistor, both the channel length and the channel width can be shortened as compared with those of a conventional equivalent. As a result, the memory cell area can be made smaller.

Furthermore, the drain region of the data storage MOS transistor is composed of an n-type region whose impurity concentration is high, and an n-type region whose impurity concentration is more than several times lower than the high impurity concentration in the preceding n-type region. On the end of the channel length of the n-type region whose impurity concentration is high, there is a slit-like opening and therefore no floating-gate electrode exists above the end.

Additionally, by forming the n-type region whose impurity concentration is high out of impurities whose diffusion coefficient is high and impurities whose diffusion coefficient is low, a field oxide film is located on the end of the channel width.

Consequently, not only can a substrate current in a write operation be prevented, but an internal step-up operation and a low power-consuming operation can also be performed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

a semiconductor substrate with an element region and a field region;

a select MOS transistor formed in said element region; and a data storage MOS transistor which is formed in said element region and which includes a source region, a drain region, a floating-gate electrode, and a control gate electrode, said floating-gate electrode having a first portion above said drain region and a second portion above said semiconductor substrate between said source region and said drain region, an insulating film thinner than a gate insulating film of said select MOS transistor being arranged between said drain region and said first portion of said floating-gate electrode and between said semiconductor substrate and said second portion of said floating-gate electrode, and said first and second portions of said floating-gate electrode being spaced apart above said element region, and connected to each other on said field region.

2. A nonvolatile semiconductor memory device according to claim 1, wherein said drain region of said data storage MOS transistor includes:

a first drain region portion arranged in a region including a place directly under said first portion of said floating-gate electrode, and a first side of which is under the space between said first and second portions of said floating-gate electrode; and a second drain region portion, a first side of which is placed on the side of said second portion of said floating-gate electrode, and a second side of which is connected to said first side of said first drain region portion, said second drain region portion having an impurity concentration which is set at least several times lower than the impurity concentration of said first drain region portion.

3. A nonvolatile semiconductor memory device according to claim 2, wherein said drain region of said data storage MOS transistor further includes a third drain region portion, a first side of which is connected to the second side of said first region, and a second side of which is placed on the side of a gate electrode of said select MOS transistor.

4. A nonvolatile semiconductor memory device according to claim 3, wherein the impurity concentration in said second drain region portion is equal to the impurity concentration in said third drain region portion.

5. A nonvolatile semiconductor memory device according to claim 3, wherein said first, second and third drain region portions also function as a source region of said select MOS transistor.

6. A nonvolatile semiconductor memory device according to claim 5, wherein the impurity concentration of said first drain region portion and that in said second drain region portion are set so that, when a positive potential is applied to said drain region of said data storage MOS transistor and a ground potential to said control gate electrode, a current starts to flow from said drain region of said data storage MOS transistor to said floating-gate electrode before a current starts to flow from said drain region of said data storage MOS transistor to said semiconductor substrate.

7. A nonvolatile semiconductor memory device according to claim 2, wherein said first drain region portion includes impurities of more than two types whose diffusion coefficient differs from each other, with the impurities whose diffusion coefficient is lower than the remaining ones of said impurities of more than two types determining the impurity concentration at the surface of said drain region of said data storage MOS transistor, and the impurities whose diffusion coefficient is higher than the remaining ones of said impurities of more than two types extending to directly under said field region.

8. A nonvolatile semiconductor memory device according to claim 7, wherein said impurities of more than two types whose diffusion coefficient differs from each other contain arsenic and phosphorus.

9. A nonvolatile semiconductor memory device according to claim 1, wherein said insulating film between said drain region and said first portion of said floating-gate electrode functions as a tunnel insulating film through which Fowler-Nordheim tunneling current flows, and said insulating film between said semiconductor substrate and said second portion of said floating-gate electrode functions as a gate insulating film of said data storage MOS transistor and as a tunnel insulating film.

10. A nonvolatile semiconductor memory device according to claim 1, wherein said insulating film between said drain region and said first portion of said floating-gate electrode and that between said semiconductor substrate and said second portion of said floating-gate electrode has a thickness of approximately 10 nm, and the gate insulating film of said select MOS transistor has a thickness of several tens nm.

11. A nonvolatile semiconductor memory device according to claim 1, wherein in said element region, the shape of said control gate electrode is the same as that of said floating-gate electrode.

12. A semiconductor memory device including a memory cell having a selection transistor and a data storage transistor, comprising:

a semiconductor substrate of a first conductivity type;

a field insulating film formed on said semiconductor substrate to define an element region;

first, second, and third impurity regions of a second conductivity type formed in said element region of said semiconductor substrate;

a gate electrode of said selection transistor provided above a first channel region between said first and second impurity regions;

a floating gate electrode of said data storage transistor having a first electrode portion provided over at least a portion of said second impurity region, and a second electrode portion, spaced apart from said first electrode portion, provided over a second channel region between said second impurity region and said third impurity region;

a first insulating film formed between said first electrode portion of said floating gate electrode and said at least a portion of said second impurity region and between said second electrode portion of said floating gate electrode and said second channel region; and a second insulating film formed between said gate electrode of said selection transistor and said first channel region, wherein the thickness of said first insulating film is less than the thickness of said second insulating film.

13. A semiconductor memory device according to claim 12, wherein the thickness of said first insulating film is approximately 10 nanometers and the thickness of said second insulating film is approximately several tens of nanometers.

14. A semiconductor memory device according to claim 12, wherein said second impurity region includes a first impurity region portion arranged between second and third impurity region portions.

15. A semiconductor memory device according to claim 14, wherein a junction between said first impurity region portion and said second impurity region portion is below the space between said first and second electrode portions of said floating gate electrode.

16. A semiconductor memory device according to claim 15, wherein a junction between said second impurity region portion and said semiconductor substrate is below an edge of the second electrode portion of said floating gate electrode.

17. A semiconductor memory device according to claim 15, wherein the impurity concentration of said second impurity region portion is less than the impurity concentration of said first impurity region portion.

18. A semiconductor memory device according to claim 17, wherein the impurity concentration of said third impurity region portion is approximately the same as the impurity concentration of said second impurity region portion.

19. A semiconductor memory device including a memory cell having a selection transistor and a data storage transistor, comprising:

a semiconductor substrate of a first conductivity type;

a field insulating film formed on said semiconductor substrate to define an element region;

first, second, and third impurity regions of a second conductivity type formed in said element region of said semiconductor substrate;

a gate electrode of said selection transistor provided above a first channel region between said first and second impurity regions;

a floating gate electrode of said data storage transistor having a first electrode portion provided at least partly over a first portion of said second impurity region having a first impurity concentration and a second electrode portion provided over a second channel region between a second portion of said second impurity region having a second impurity concentration and said third impurity region.

20. The semiconductor memory device according to claim 19, wherein said second impurity region includes a third portion having a third impurity concentration such that said first portion of said second impurity region is disposed between said second and third portions of said second impurity region.

21. The semiconductor memory device according to claim 20, wherein the second and third impurity concentrations are approximately equal.

22. The semiconductor memory device according to claim 21, wherein the first impurity concentration is greater than the second and third impurity concentrations.

23. The semiconductor memory device according to claim 19, wherein said second impurity region constitutes a drain of said data storage transistor and a source of said selection transistor.

* * * * *